United States Patent
Llapitan et al.

(10) Patent No.: US 9,681,556 B2
(45) Date of Patent: Jun. 13, 2017

(54) CONTACT PROTECTION FOR INTEGRATED CIRCUIT DEVICE LOADING

(71) Applicants: David J. Llapitan, Tacoma, WA (US); Neal E. Ulen, Yelm, WA (US); Jeffory L. Smalley, East Olympia, WA (US)

(72) Inventors: David J. Llapitan, Tacoma, WA (US); Neal E. Ulen, Yelm, WA (US); Jeffory L. Smalley, East Olympia, WA (US)

(73) Assignee: INTEL CORPORATION, Santa Clara, CA (US)

( * ) Notice: Subject to any disclaimer, the term of this patent is extended or adjusted under 35 U.S.C. 154(b) by 479 days.

(21) Appl. No.: 13/631,806

(22) Filed: Sep. 28, 2012

(65) Prior Publication Data

US 2014/0092573 A1     Apr. 3, 2014

(51) Int. Cl.
*H05K 3/30*     (2006.01)
*H05K 7/10*     (2006.01)

(52) U.S. Cl.
CPC .......... *H05K 3/301* (2013.01); *H05K 7/1007* (2013.01); *H05K 7/1061* (2013.01); *H05K 2201/10325* (2013.01); *H05K 2201/2018* (2013.01); *H05K 2203/167* (2013.01)

(58) Field of Classification Search
CPC .... H05K 3/301; H05K 7/1007; H05K 7/1061; H05K 2203/167; H05K 2201/2018; H05K 2201/10325
USPC ....... 361/719, 807, 704, 726, 756, 772, 810; 439/331, 73; 257/719, E23.086, 797, 257/E21.002, E23.179
See application file for complete search history.

(56) References Cited

U.S. PATENT DOCUMENTS

| | | | |
|---|---|---|---|
| 7,083,456 B2* | 8/2006 | Trout et al. | 439/326 |
| 7,371,100 B1* | 5/2008 | Polnyi | 439/331 |
| 7,699,637 B2 | 4/2010 | Yeh | |
| 7,824,188 B2 | 11/2010 | Yokoyama | |
| 7,826,229 B2 | 11/2010 | Cromwell et al. | |
| 7,867,006 B2 | 1/2011 | Yeh | |
| 8,052,451 B2 | 11/2011 | Yeh | |
| 8,439,693 B2 | 5/2013 | Yeh et al. | |
| 8,816,496 B2* | 8/2014 | Lee | H01L 23/4006 165/80.3 |

(Continued)

OTHER PUBLICATIONS

Haq, M.N., "Tukwila EC Design", Intel Presentation, Doc last saved Sep. 7, 2012, 17 pp.

(Continued)

*Primary Examiner* — Adrian S Wilson
*Assistant Examiner* — Abhishek Rathod
(74) *Attorney, Agent, or Firm* — Konrad Raynes Davda & Victor LLP

(57) ABSTRACT

In one embodiment, a load frame and an integrated circuit device are aligned, with a base frame carried on a substrate, along a first alignment axis defined by a first alignment post extending from the base frame to the load frame, in a direction transverse to the substrate, and a first biasing device carried on the base frame is actuated to engage and bias the load frame toward the base frame aligned with the load frame, and to bias the integrated circuit toward the substrate. A latch latches the load and base frames together, aligned with and biased towards each other with the integrated circuit device and the substrate aligned with, and biased toward each other. Other aspects and features are also described.

28 Claims, 14 Drawing Sheets

(56) References Cited

U.S. PATENT DOCUMENTS

| | | |
|---|---|---|
| 2004/0018755 A1 | 1/2004 | Ma |
| 2005/0111191 A1 | 5/2005 | Lee et al. |
| 2005/0160592 A1 | 7/2005 | Eckblad et al. |
| 2006/0022335 A1 | 2/2006 | Kao |
| 2006/0056152 A1 | 3/2006 | Lie et al. |
| 2008/0081489 A1* | 4/2008 | MacGregor et al. ........... 439/71 |
| 2008/0220643 A1* | 9/2008 | Zhang ........................ 439/331 |
| 2008/0280474 A1 | 11/2008 | Fan et al. |
| 2009/0021917 A1* | 1/2009 | Floyd et al. ................... 361/719 |
| 2009/0197454 A1* | 8/2009 | Liao ............................. 439/331 |
| 2009/0203245 A1 | 8/2009 | Chiang |
| 2010/0093320 A1 | 4/2010 | Ha et al. |
| 2010/0099294 A1* | 4/2010 | Yeh ..................... H05K 7/1053 439/366 |
| 2010/0120268 A1 | 5/2010 | Yeh |
| 2010/0157563 A1* | 6/2010 | Llapitan ............... H05K 7/1007 361/807 |
| 2010/0184314 A1 | 7/2010 | Yeh |
| 2010/0330824 A1* | 12/2010 | Ulen et al. ..................... 439/73 |
| 2011/0157833 A1 | 6/2011 | Bohannon et al. |
| 2011/0294330 A1 | 12/2011 | Dai |
| 2012/0156913 A1* | 6/2012 | Haswarey et al. ............ 439/331 |
| 2012/0156919 A1 | 6/2012 | Yeh et al. |
| 2012/0162923 A1 | 6/2012 | Lee et al. |
| 2013/0078827 A1 | 3/2013 | Yeh et al. |
| 2014/0071647 A1 | 3/2014 | Bridges et al. |
| 2014/0092547 A1 | 4/2014 | Boyd et al. |
| 2016/0105974 A1 | 4/2016 | Boyd et al. |

OTHER PUBLICATIONS

Ikea, "Ikea Cam Lock", dated prior to prior to Sep. 28, 2012, 1 pp.
Ikea, "Ikea Cam Lock and Screw", dated prior to prior to Sep. 28, 2012, 1 pp.
Intel Corporation, "Intel Core i7-900 Desktop Processor Extreme Edition Series and Intel Core i7-900 Desktop Processor Series and LGA1366 Socket", Thermal and Mechanical Design Guide, Mar. 2011, 72 pp.
Intel Corporation, "Intel Xeon Processor7500 Series Intel Xeon Processor E7-8800/480012800 Product Families", Thermal and Mechanical Design Guide, Apr. 2011, 102 pp. [Submitted in two parts to make compatible with USPTO file size restrictions].
Restriction Requirement for U.S. Appl. No. 13/631,743, dated Jul. 14, 2014, 7 pp.
Response to Restriction Requirement for U.S. Appl. No. 13/631,743, dated Nov. 14, 2014, 10 pp.
Office Action 1 for U.S. Appl. No. 13/631,743, dated Jan. 30, 2015, 17 pp.
Response to Office Action 1 for U.S. Appl. No. 13/631,743, dated Apr. 30, 2015, 12 pp.
Notice of Allowance 1 for U.S. Appl. No. 13/631,743, dated May 22, 2015, 13 pp.
Notice of Allowance 2 for U.S. Appl. No. 13/631,743, dated Sep. 9, 2015, 21 pp.

\* cited by examiner

CONTACT PROTECTION FOR INTEGRATED CIRCUIT DEVICE LOADING

BACKGROUND

Description of Related Art

Integrated circuits typically include various active and passive circuit elements which have been integrated into a piece of semiconductor material, often referred to as a die. The die may, in turn, be encapsulated into a package, which often includes a ceramic or plastic substrate although other materials may be used. These packages are usually physically attached to a printed circuit board or other substrate.

Integrated circuit packages frequently generate a large amount of heat. Accordingly, the larger integrated circuit packages for large integrated circuits such as processors typically have a thermal device such as a heat sink installed on an outer surface of the integrated circuit package to draw heat energy from the integrated circuit package to cool the integrated circuits of the package.

Printed circuit boards frequently include a socket or other receptacle in which the integrated circuit package is inserted. The socket typically includes a large number of electrical contacts which engage corresponding electrical contacts on the exterior of the integrated circuit package to electrically interconnect circuits within the integrated circuit package with other circuits mounted on or embedded within the printed circuit board. The electrical contacts include for example, pin grid arrays (PGA), ball grid arrays (BGA) and land grid arrays (LGA).

The electrical contacts of the socket and the integrated circuit package are frequently very large in number. Accordingly, the contacts tend to be relatively small and therefore relatively fragile and susceptible to damage, particularly when the integrated circuit package is installed in the socket by hand. Also, due to the large number, the contacts are often arranged in large arrays with relatively little space between the individual contacts. Hence, proper alignment between the contacts of the integrated circuit package and the socket is frequently a challenge.

Various devices have been proposed for loading the integrated circuit package into a socket. For example, tools have been proposed to hold the integrated circuit package while installing and removing integrated circuit packages from the socket. Some integrated circuit packages are designed for the installer to hold the integrated circuit package by wings extending from an integrated heat spreader of the package.

Other devices have been proposed for securely latching the integrated circuit package once placed within the socket. In one such design, a hinged load plate is pivoted into position over the integrated circuit package in the socket and spring lever arms are latched over the load plate to provide a loading pressure onto the load plate over the integrated circuit package to secure the integrated circuit package in the socket. Some devices, often referred to as an integrated assembly, are intended for both functions, that is, both loading the integrated circuit package into the socket and latching it in place. In some applications, a heat sink is installed on the integrated circuit package after the integrated circuit package is installed in the socket. In others, a loading device is intended to facilitate installation of a preassembly of both the integrated circuit and the heat sink at the same time.

BRIEF DESCRIPTION OF THE DRAWINGS

Referring now to the drawings in which like reference numbers represent corresponding parts throughout.

DETAILED DESCRIPTION OF THE ILLUSTRATED EMBODIMENTS

In the following description, reference is made to the accompanying drawings which form a part hereof and which illustrate several embodiments of the present disclosure. It is understood that other embodiments may be utilized and structural and operational changes may be made without departing from the scope of the present description.

Figure 1:
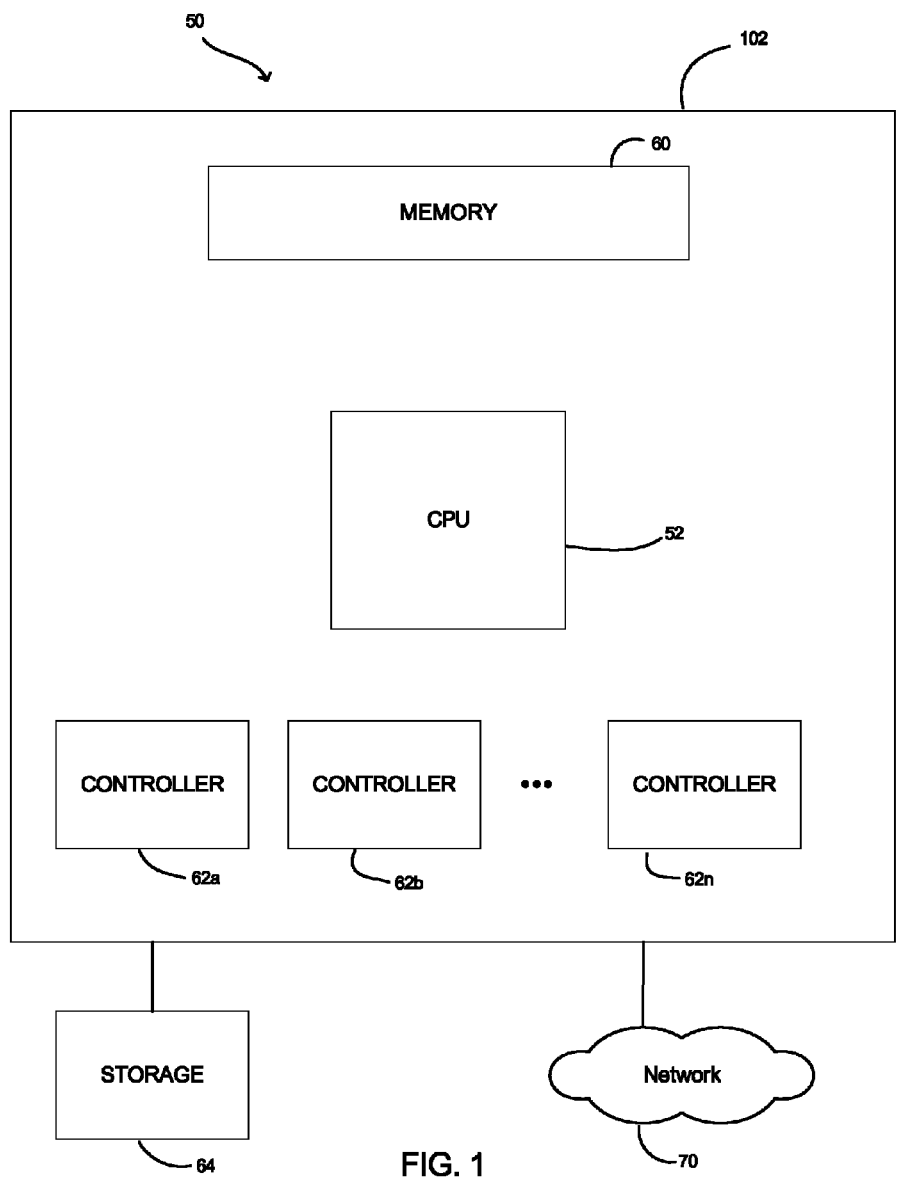
FIG. 1 illustrates one embodiment of a computing environment in which aspects of the description provided herein may be embodied.

FIG. 1 illustrates a computing environment in which aspects of described embodiments may be embodied. A computer 50 includes one or more central processing units (CPU) 52 (only one is shown), a memory 60 and a plurality of controllers 62a, 62b . . . 62n. Each of the CPU 52, memory 60 and controllers 62a, 62b . . . 62n include one or more electronic devices. One such electronic device is represented by an electronic device 100 depicted in the exploded assembly view of FIG. 2. Once fully assembled, the device 100 is electrically and mechanically coupled to a printed circuit board 102.

The device 100 of this embodiment includes a stack comprising an integrated circuit package 104, which is received in a socket 106. The integrated circuit package 104 and socket 106 are compressed together between a load frame 110 (FIG. 3) and a base frame 112 (FIG. 4) by a pair of biasing devices 120a, 120b which are shown in a non-actuated, non-latched position in FIGS. 2-6, and in an actuated and latched position in FIG. 7.

In the illustrated embodiment, the load and base frames 110, 112 each have generally rectangular cores 126, 128, respectively. It is appreciated that the load and base frames 110, 112 may have other shapes, depending upon the particular application. For example, the cores may conform generally to the shape of the integrated circuit and its socket in some embodiments. Although the stack 100 is shown including an integrated circuit package, it is appreciated that other integrated circuit devices such as integrated circuit dies without packages may be utilized as well.

In accordance with one aspect of the present description, the load frame 110 and the integrated circuit package 104 carried by the load frame 110, may be aligned with the base frame 112 carried on the printed circuit board 102, along a first alignment axis 124a extending from the base frame 112 to the load frame 110, and then biased together using the biasing device 120a which is carried on the base frame 112. In a similar manner, the load frame 110 and the integrated circuit package 104 carried by the load frame 110, may also be aligned with the base frame 112 along a second alignment axis 124b extending from the base frame 112 to the load frame 110, and then biased together using a biasing device 120b which is also carried on the base frame 112.

Figure 4:
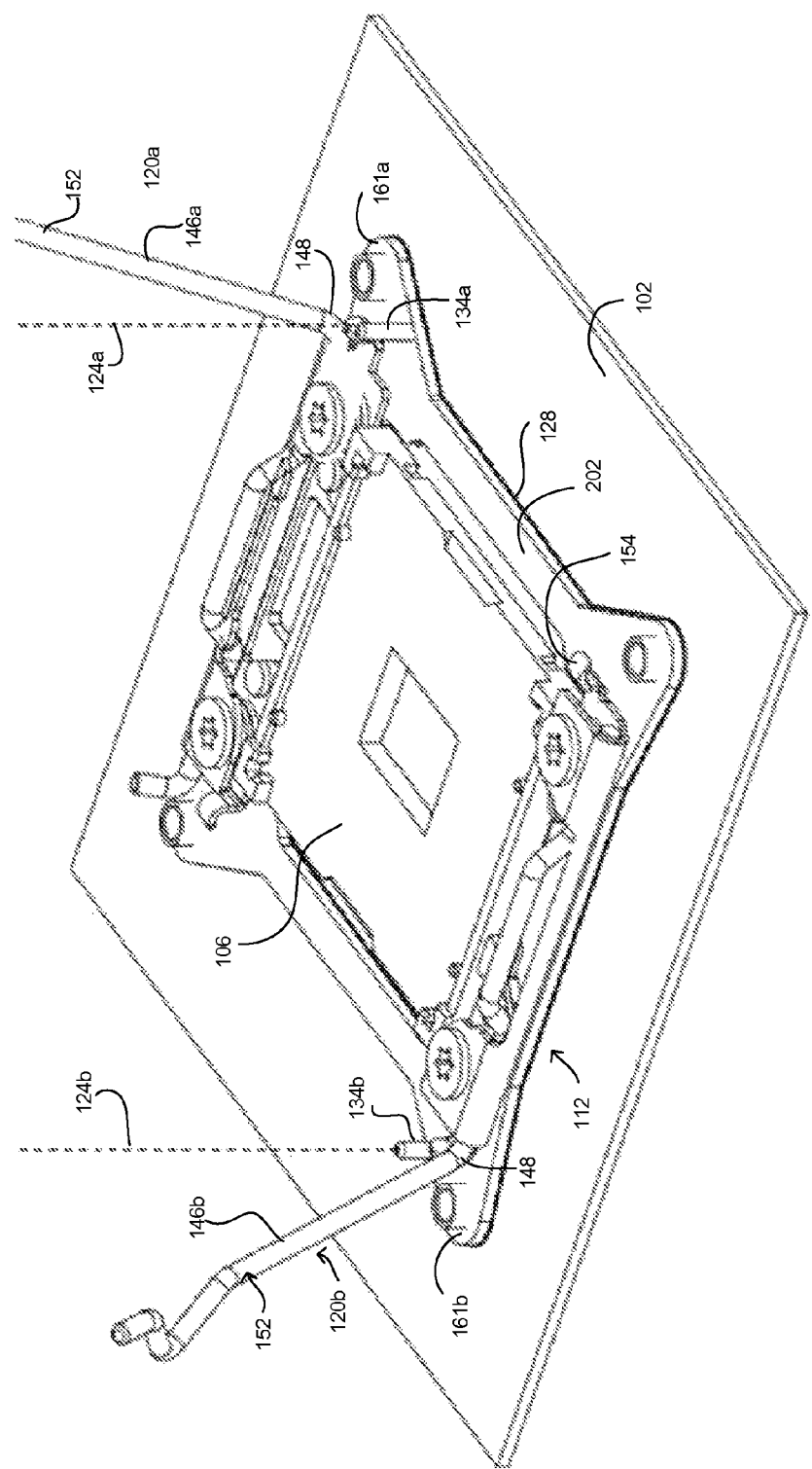
FIG. 4 illustrates a base frame and socket preassembly of the integrated circuit package stack of FIG. 2.

In the illustrated embodiment, the alignment axes 124a, 124b are defined by a pair of alignment posts 134a, 134b (FIG. 4). Although the illustrated embodiment depicts a pair of biasing devices 120a, 120b, and a pair of alignment posts 134a, 134b, it is appreciated that in some embodiments, there may be more or fewer biasing devices, and alignment posts, depending upon the particular application. Also, although the posts 134a, 134b are depicted as generally cylindrical in the illustrated embodiments, it is appreciated that other shapes may be used, depending upon the particular application. For example, the alignment posts and associated alignment openings may have a rectangular cross-section.

As explained in greater detail below, such an arrangement provides alignment of the integrated circuit package 104 to the socket 106 in a manner which can, it is believed, reduce or eliminate inadvertent damage to the electrical contacts of the device 100. In addition, the complexity of the device 100 may be reduced as compared to other designs. For example, the stack 100 obviates the use of hinges relied upon in some prior designs. Also, separate installation tools for handling the integrated circuit package 104 may be obviated.

In another aspect of the present description, the load frame 110 includes first and second finger grip handles 135a, 135b which extend laterally away from the rectangular core 126 of the load frame 110. As explained in greater detail below, it is believed that the finger grip handles 135a, 135b facilitate safer handling of the load frame 110 to reduce or eliminate inadvertent dropping of the load frame 110 and damaging the integrated circuit package 104 or the socket 106 or both. In addition, it is believed that the finger grip handles 135a, 135 facilitate maintaining hands and fingers a safer distance from the integrated circuit package 104 and the socket 106 to reduce inadvertent damage to the contacts of the stack 100. Other features may be realized in addition to or instead of these features described herein, depending upon the particular application. Although the illustrated embodiment depicts a pair of finger grip handles 135a, 135b on opposing sides of the rectangular core 126 of the load frame 110, it is appreciated that in some embodiments, there may be more or fewer finger grip handles for the load frame, depending upon the particular application.

The printed circuit board 102 may be a single layer or multi-layered motherboard which has a plurality of conductive lines that provide communication between the circuits in the device 100 and other components mounted to the board 102. Alternatively, one or more of the CPU 52, memory 60 and controllers 62a, 62b . . . 62n may be disposed on other substrates such as daughter cards, expansion cards, package substrates, etc.

An operating system and various applications execute on the CPU 52 and reside in the memory 60. The content residing in memory 60 may be cached in accordance with known or subsequently developed caching techniques. Programs and data in memory 60 may be swapped into storage 64 as part of memory management operations. The computer 50 may comprise any computing device known in the art or subsequently developed, such as a mainframe, server, personal computer, workstation, laptop, handheld computer, telephony device, network appliance, virtualization device, storage controller, network controller, etc. Any suitable CPU 52 and operating system known in the art or subsequently developed, may be used.

The controllers 62a, 62b . . . 62n may include a system controller, peripheral controller, memory controller, hub controller, I/O bus controller, video controller, network controller, storage controller, etc. For example, a storage controller can control the reading of data from and the writing of data to the storage 64 in accordance with a storage protocol layer. The storage protocol of the layer may be any of a number of storage protocols presently known or subsequently developed. Data being written to or read from the storage 62 may be cached in accordance with known or subsequently developed caching techniques.

A network controller can include one or more protocol layers to send and receive network packets to and from remote devices over a network 70. The network 70 may comprise a Local Area Network (LAN), the Internet, a Wide Area Network (WAN), Storage Area Network (SAN), etc. Embodiments may be configured to transmit data over a wireless network or connection. In certain embodiments, the network controller and various protocol layers may employ the Ethernet protocol over unshielded twisted pair cable, token ring protocol, Fibre Channel protocol, etc., or any other network communication protocol known in the art or subsequently developed.

In the illustrated embodiment, load frame 110 carries the integrated circuit package aligned with the load frame 110. In addition, the base frame 112 and the socket 106 are secured to the printed circuit board 102 or other supporting substrate aligned with respect to each other. Hence, in one embodiment, alignment of the load frame 110 to the base frame 112 can result in alignment of the integrated circuit package 104 to the socket 106 as well.

It is appreciated that in some embodiments, one or both of a heat sink or socket may not be present. For example, in some applications, an integrated circuit package may be installed directly onto contacts on a printed circuit board or other substrate, without an associated socket. Thus, the integrated circuit package 104 may be biased by biasing devices toward the printed circuit board 102 or other substrate and latched in the aligned position on the printed circuit board 102 without an intervening socket 106.

In the illustrated embodiment, the integrated circuit package 104 has an integrated heat spreader structure 137 positioned within a central aperture 138 the rectangular core 126 of the load frame 110. A heat sink may be thermally coupled to the integrated heat spreader structure 137. It is appreciated that in some embodiments, the stack 100 may lack a heat sink.

Figure 8:
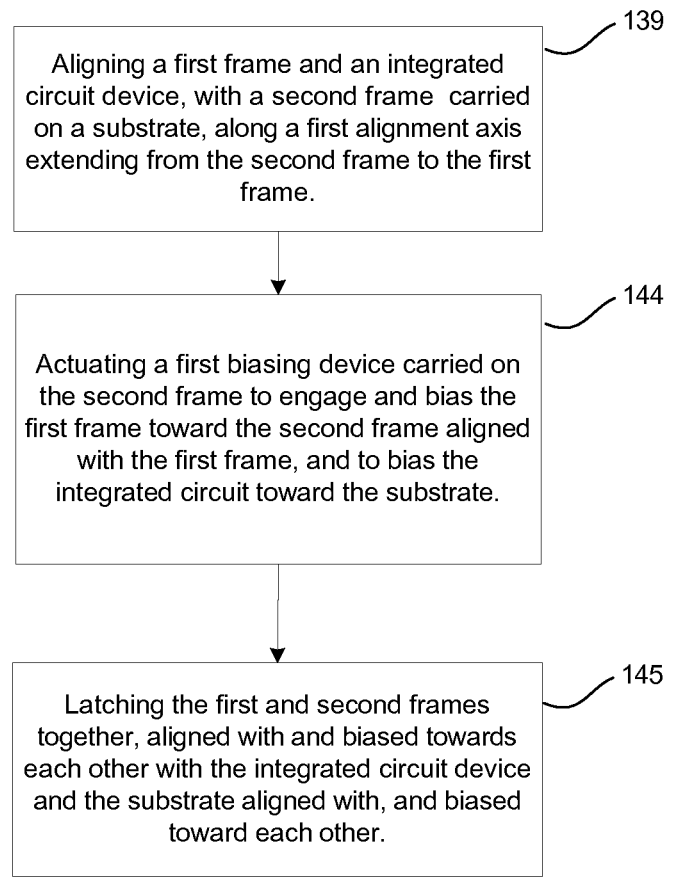
FIG. 8 depicts one example of operations for installing an integrated circuit package on a printed circuit board or other substrate, in accordance with one embodiment of the present description.

FIG. 8 depicts one example of operations for installing an integrated circuit package on a printed circuit board or other substrate, in accordance with one embodiment of the present description. In one operation, a load frame such as the load frame 110 is aligned (block 139) with a base frame, such as the base frame 112, carried on a substrate such as the printed circuit board 102, along one or more alignment axes such as the alignment axes 124a, 124b extending from the base frame to the load frame.

In the illustrated embodiment, an integrated circuit package, such as the integrated circuit package 104, is preassembled to the load frame 110 as shown in FIG. 4, for example, before the load frame is mated with the base frame 112. For example, the integrated circuit package 104 may be clipped or otherwise temporarily attached to the bottom of the load frame 110 to temporarily secure the integrated circuit package in an aligned position on the bottom of the load frame 110. Thus, by aligning the integrated circuit package 104 to the load frame 110, the integrated circuit package 104 will also be aligned with respect to the socket 106 and the base frame 112, when the load frame 110 is aligned to the base frame 112.

In one embodiment, a heat sink may be coupled to the integrated circuit package 104 before the load frame 110 is mated with the base frame 112. In other embodiments, the heat sink may be coupled to the integrated circuit package 104 after the load frame 110 is mated with the base frame 112 and the integrated circuit package 104 is installed in the socket 106. A suitable thermal paste or other heat transfer medium may be applied between the integrated heat spreader of the integrated circuit package 104 and a heat sink to facilitate the transfer of heat energy from the integrated circuit package to the heat sink 126 during operation of the integrated circuit package 104. The heat sink may be omitted in some embodiments. Other techniques may be used to preassemble the integrated circuit package 104 to the load frame 110 depending upon the particular application. In other embodiments, the integrated circuit package may be placed in the socket 106 before the load frame 110 is mated with the base frame 112.

In the illustrated embodiment, the load frame 110 is aligned to the base frame 112 by grasping the finger grip handles 135a, 135b and lowering the load frame 110 toward the base frame 112 so that alignment posts 134a, 134b (FIG. 4) which extend from the base frame 112, are inserted into the alignment openings 136a, 136b respectively, defined by the load frame 110. The load frame 110 may be grasped and lowered on the base frame 112 by a human assembler or a robotic assembler.

In the illustrated embodiment, the alignment posts 134a and 134b and the alignment axes 124a, 124b defined by them, are parallel to each other and orthogonal to the plane of the printed circuit board 102. Hence, the lowering motion of the load frame to install is in the direction defined by the alignment axes 124a, 124b. Although the alignment posts 134a and 134b and the alignment axes 124a, 124b defined by them, are orthogonal to the plane of the printed circuit board 102 in the illustrated embodiment, it is appreciated that the alignment posts 134a and 134b and the alignment axes 124a, 124b defined by them, may be at other angles transverse to the plane of the printed circuit board 102.

Figure 5:
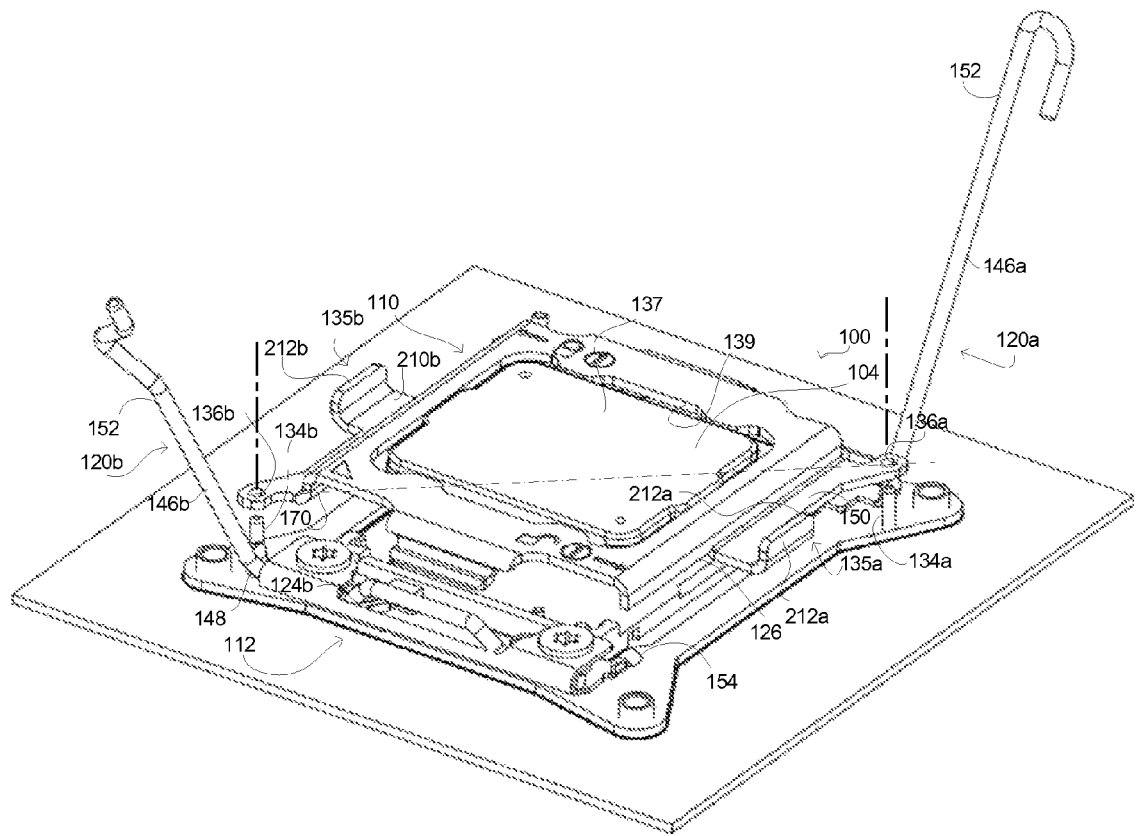
FIG. 5 illustrates a loading position of the load frame during installation of the integrated circuit package stack of FIG. 2.
Figure 9A:
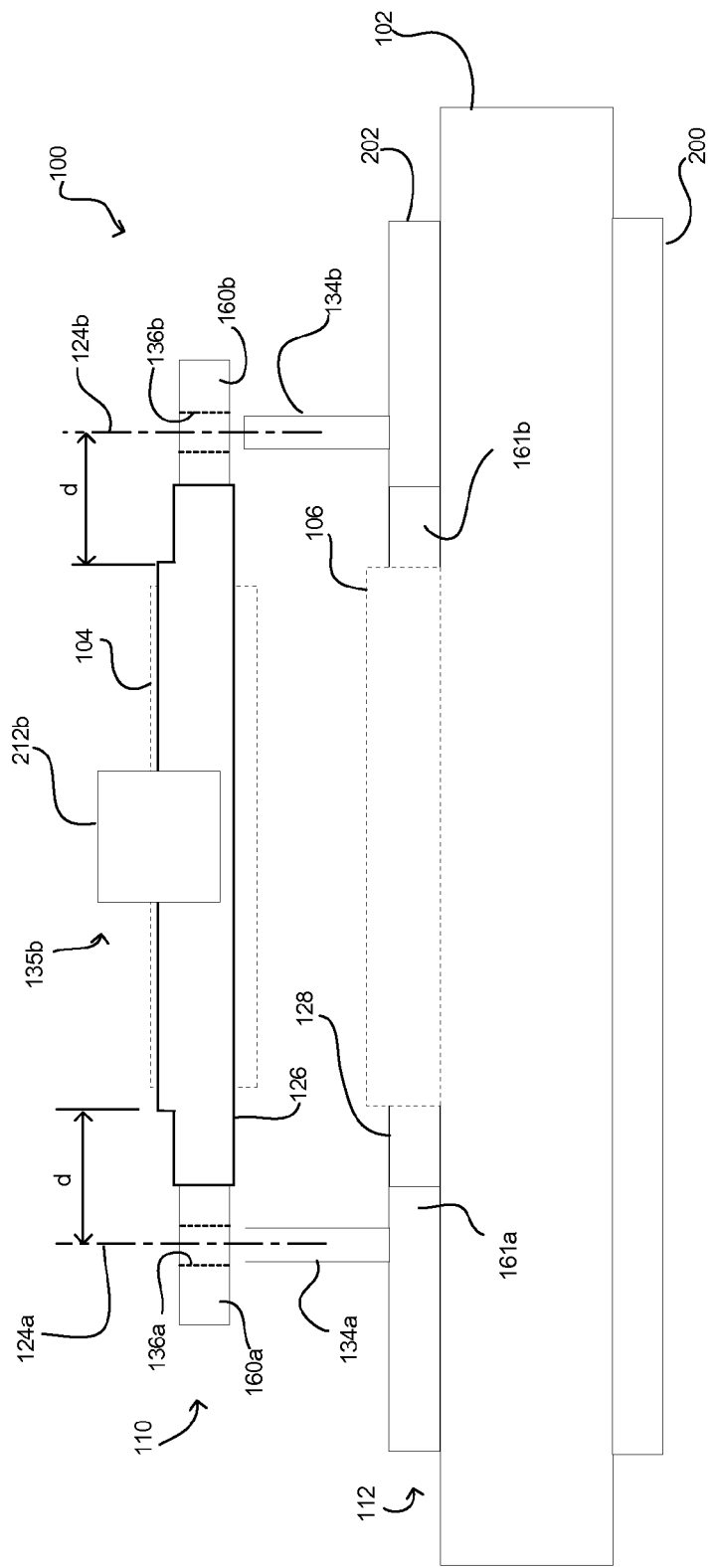
FIG. 9a is a schematic diagram illustrating the loading position of the load frame during installation of the integrated circuit package stack as depicted in FIG. 5.

FIG. 5 depicts the integrated circuit package 104 suspended by the load frame 110 over the socket 106 positioned within the base frame 112 such that the electrical contacts of the integrated circuit package 104 and the socket 106 have not yet engaged each other. This position is schematically represented in the schematic diagram of FIGS. 9a, 9c.

Figure 10A:
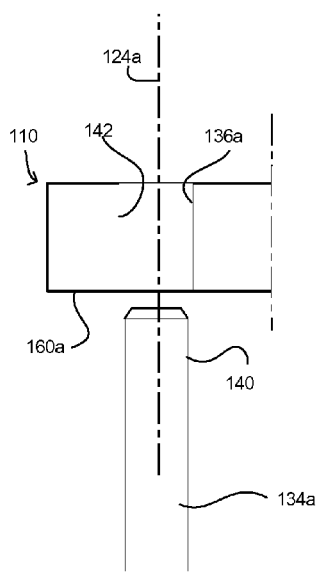
FIG. 10a is a schematic cross-sectional diagram illustrating the loading position of the load frame during installation of the integrated circuit package stack as depicted in FIG. 5.
Figure 10B:
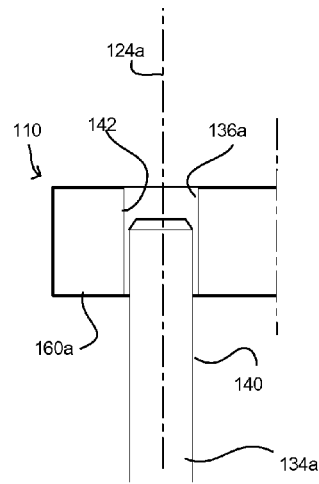
FIG. 10b is a schematic cross-sectional diagram illustrating another loading position of the load frame during installation of the integrated circuit package stack of FIG. 2.

In this position, the alignment posts 134a, 134b have not yet been inserted into the corresponding alignment openings 136a, 136b of the load frame 110 as best seen for the alignment post 134a and alignment opening 136a in the partial cross sectional schematic view of FIG. 10a. Each alignment post 134a, 134b, as depicted for the alignment post 134a, has an alignment surface 140. Similarly, the each alignment opening 136a, 136b as depicted for the alignment opening 136a, has an alignment surface 142 which is engaged by the alignment surface 140 as the alignment posts 134a, 134b (FIG. 5) which extend from the base frame 112, are inserted (FIG. 10b) into alignment openings 136a, 136b of the load frame 110.

In one aspect of the present description, it is believed that as the load frame 110 slides down the alignment posts 134a, 134, the attitude of the load frame 110 is somewhat restricted to the horizontal plane (that is, parallel to the socket 106 and printed circuit board 102). The degree of restriction is a function of the tolerances of the diameters of the alignment posts 134a, 134b and the associated alignment openings 136a, 136b of the load frame 110. For example, it is believed that the deviation from true horizontal attitude or parallel attitude may be restricted to be ten degrees or less. It is appreciated that in other embodiments, the range of attitude restriction may be greater or less, depending upon the particular application.

Figure 6:
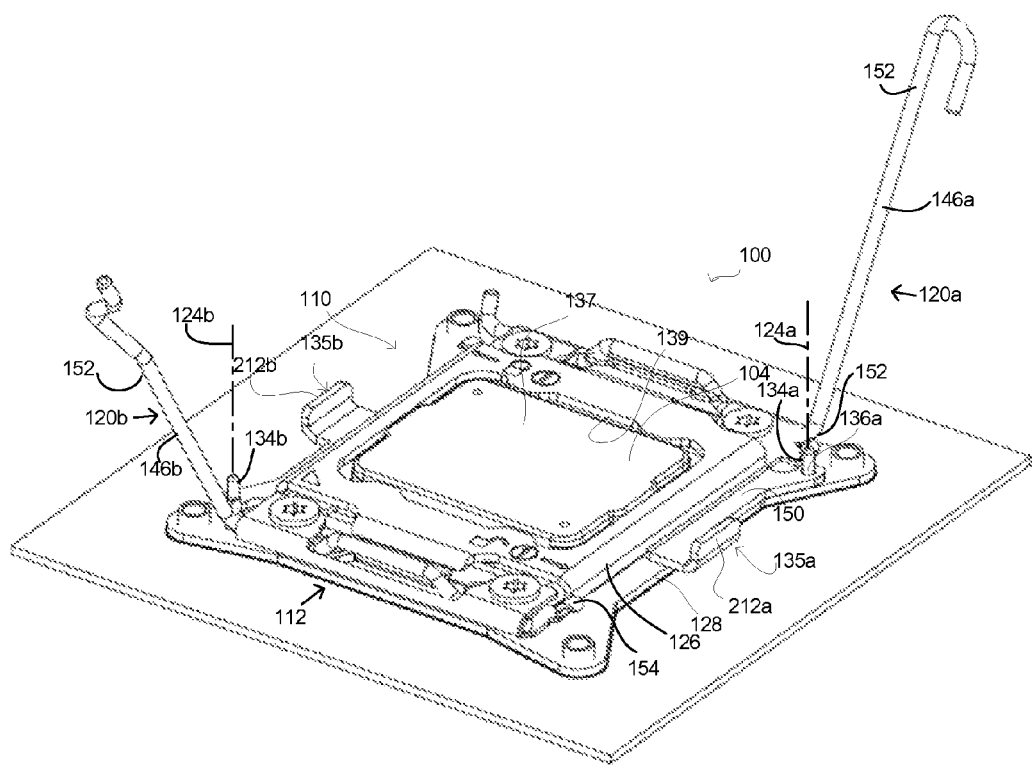
FIG. 6 illustrates another loading position of the load frame during installation of the integrated circuit package stack of FIG. 2.
Figure 9B:
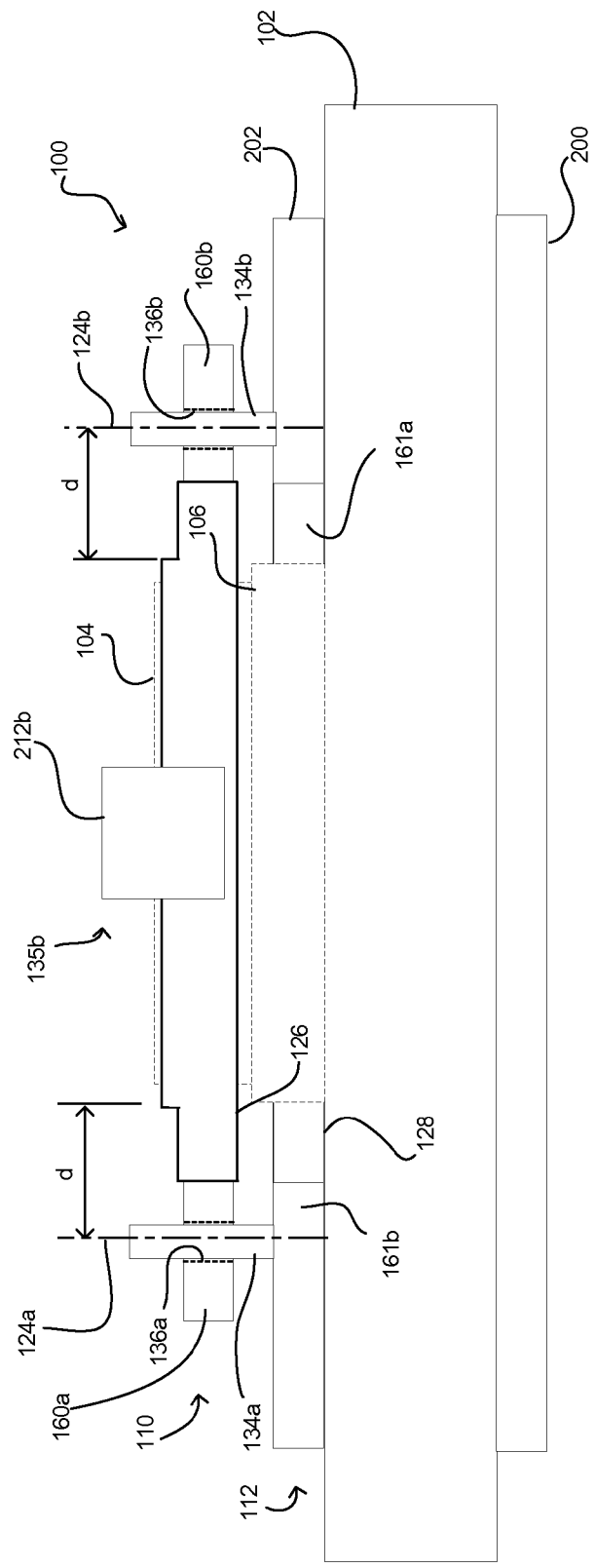
FIG. 9b is a schematic diagram illustrating the loading position of the load frame during installation of the integrated circuit package stack as depicted in FIG. 6.
Figure 10C:
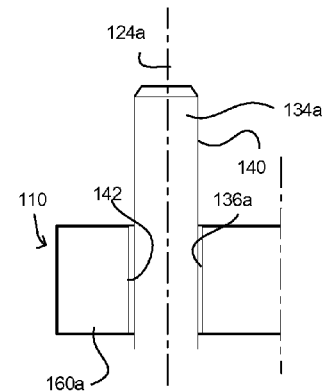
FIG. 10c is a schematic cross-sectional diagram illustrating the loading position of the load frame during installation of the integrated circuit package stack as depicted in FIG. 6.

The insertion continues until the load frame 110 reaches the position depicted in FIGS. 9b, 10c and FIG. 6. In this manner, the load frame 110 and the base frame 112 may be precisely aligned with respect to each other, resulting in precise alignment of the integrated circuit package 104 and the socket 106, as well. In the position depicted in FIGS. 6, 9b and 10c, the electrical contacts of the integrated circuit package 104 engage and are resting on the electrical contacts of the socket 106 which are aligned with the electrical contacts of the integrated circuit package 104 by the alignment achieved between the load frame 110 and the base frame 112. Once the electrical contacts of the integrated circuit package 104 are resting on the contacts of the socket 106, with the load frame 110 and the integrated circuit package aligned with respect to the socket 106 and the base frame 112 as discussed above, the load frame 110 may be released by the human or robotic assembler.

In another operation, a biasing device carried on the base frame may be actuated (block 144, FIG. 8) to engage and bias the load frame toward the base frame aligned with the load frame, and to bias the integrated circuit toward the substrate. In addition, the load and base frames may be latched (block 145) together, aligned with and biased towards each other with the integrated circuit device and the substrate aligned with, and biased toward each other.

Figure 2:
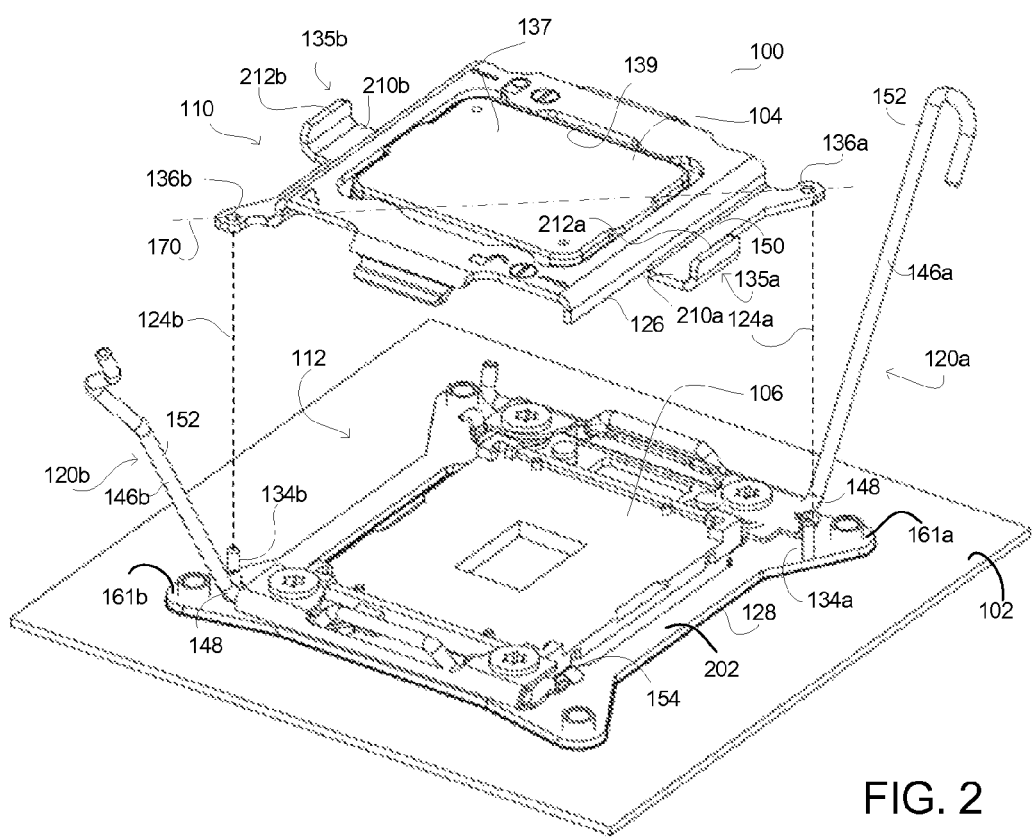
FIG. 2 is an exploded diagram of an integrated circuit package stack in accordance with one embodiment of the present description.

In the illustrated embodiment, the load frame 110 may be biased toward and latched to the base frame 112 by actuating and latching the biasing devices 120a, 120b. In this example, the biasing devices 120a, 120b include spring lever arms 146a, 146b which are each pivotally coupled at one end 148 to the base frame 112. FIGS. 2, 5 and 6 show the spring lever arms 146a, 146b in the fully open pivot position.

Figure 7:
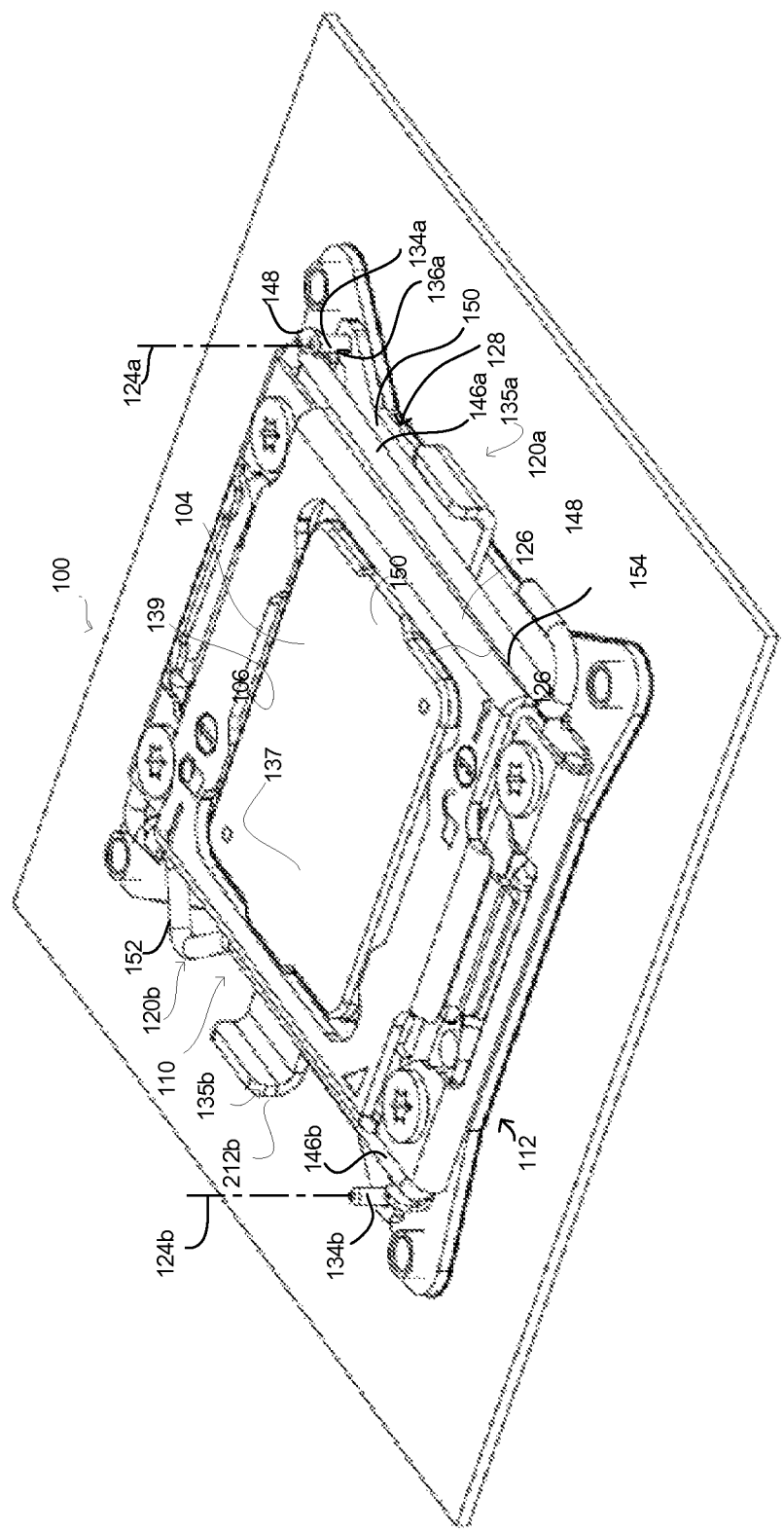
FIG. 7 illustrates an installed position of the load frame of the integrated circuit package stack of FIG. 2.

The spring lever arms 146a, 146b are actuated by pivoting the spring lever arms 146a, 146b to engage a top surface 150 of the load frame 110 as shown in FIG. 7. This position is schematically represented in the schematic diagram of FIG. 9d. The spring lever arms 146a, 146b may be latched in the fully closed pivot position by positioning the other end 152 of each spring lever arms 146a, 146b under a latch surface 154 of the base frame 112. In this position, the spring lever arms 146a, 146b exert a spring biasing force on the top surface 150 of the load frame 110 which biases the load frame 110 toward the base frame 112 in alignment with each other along the alignment axes 124a, 124b. In addition, the integrated circuit package 104 and the socket 106 positioned between the load frame 110 and the printed circuit board 102 are biased toward each other in alignment with each other along the alignment axes 124a, 124b.

In another aspect of the present description, the alignment openings 136a, 136b of the load frame 110 are defined by flanges 160a, 160b (FIG. 3) which extend laterally from the rectangular core 126 of the load frame 110. As best seen in the schematic diagram of FIG. 9a, the alignment openings 136a, 136b are spaced a lateral distance "d" from the integrated circuit package 104 when being installed in the socket 106. Similarly, the alignment posts 134a, 134b of the base frame 112 are spaced the lateral distance "d" from the integrated circuit 104 by flanges. In the illustrated embodiment, the distance d is approximately 10 m. It is believed that such an arrangement can reduce or eliminate inadvertent damage to the contacts of the integrated circuit package 104 and the socket 106 while the alignment posts 134a, 134b of the base frame 112 are being inserted into the alignment openings 136a, 136b of the load frame flanges 160a, 160b during installation. Other lateral distance displacements may also be suitable such as a distance d in a range of 5-20 mm, for example. Other lateral distance displacement values may also be used depending upon the particular application.

In yet another aspect of the present description, the rectangular core 126 of the load frame 110 defines a diagonal axis 170 (FIG. 3) passing through a center of the rectangular core 126. In the illustrated embodiment, the first and second alignment openings 136a, 136b of the load frame flanges 160a, 160b, respectively, are aligned with the diagonal axis 170. Accordingly, the first and second alignment axes 124a, 124b are transverse to and aligned with (that is, pass through) the diagonal axis 170 of the load frame 110 when the load frame 110 and its associated integrated circuit package 104, are aligned with the base frame 112 and its associated socket 106 carried on the printed circuit board 102 or other substrate, along the respective first and second alignment axes 124a, 124b extending from the base frame 112 to the load frame 110. It is believed that such an arrangement facilitates safe handling of the load frame 110 while being installed on the base frame 112.

In the illustrated embodiment, the base frame 112 includes a lower plate 200 (shown in schematic form in FIG. 9a) which is secured to the underside of the printed circuit board 102. In addition, the base frame 112 includes an upper plate 202 (best seen in FIG. 4) which is secured to the upper side of the printed circuit board 102. The plates 200, 202 may be secured to the printed circuit board 102 using any suitable mechanical fasteners, adhesives or other bonding elements. The socket 106 is secured and electrically coupled to the printed circuit board 102 within an aperture of the upper plate 202, by soldering, for example. Other bonding techniques may be used, depending upon the particular application. In the illustrated embodiment, the plates 200, 202 may be secured to each other using screw and nut fasteners, for example, which pass through the printed circuit board 102, compressing the printed circuit board 102 between the lower and upper plates, 200, 202 of the base frame 112. Although the base frame 112 is depicted as including two plates, it is appreciated that in other embodiments, the frame 112 may have fewer or more plates or structures, depending upon the particular application.

The alignment posts 134a, 134b, which define the alignment axes 124a, 124b, respectively, are secured to the upper surface of the upper plate 202 of the base frame 112 in an upstanding position. The alignment posts may be formed integrally with the upper plate 202 or may be secured to the upper plate 202 using suitable fasteners.

Figure 3:
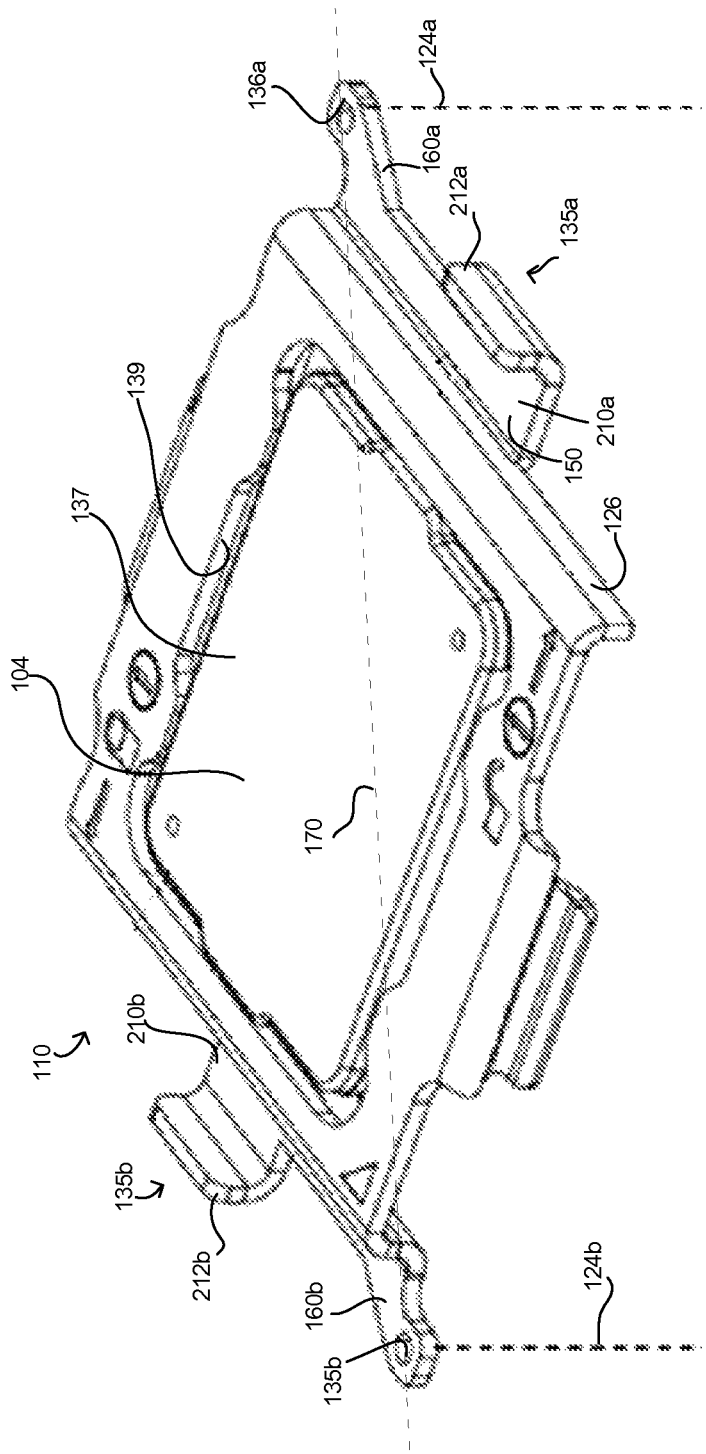
FIG. 3 illustrates a load frame and integrated circuit package preassembly of the integrated circuit package stack of FIG. 2.
Figure 9C:
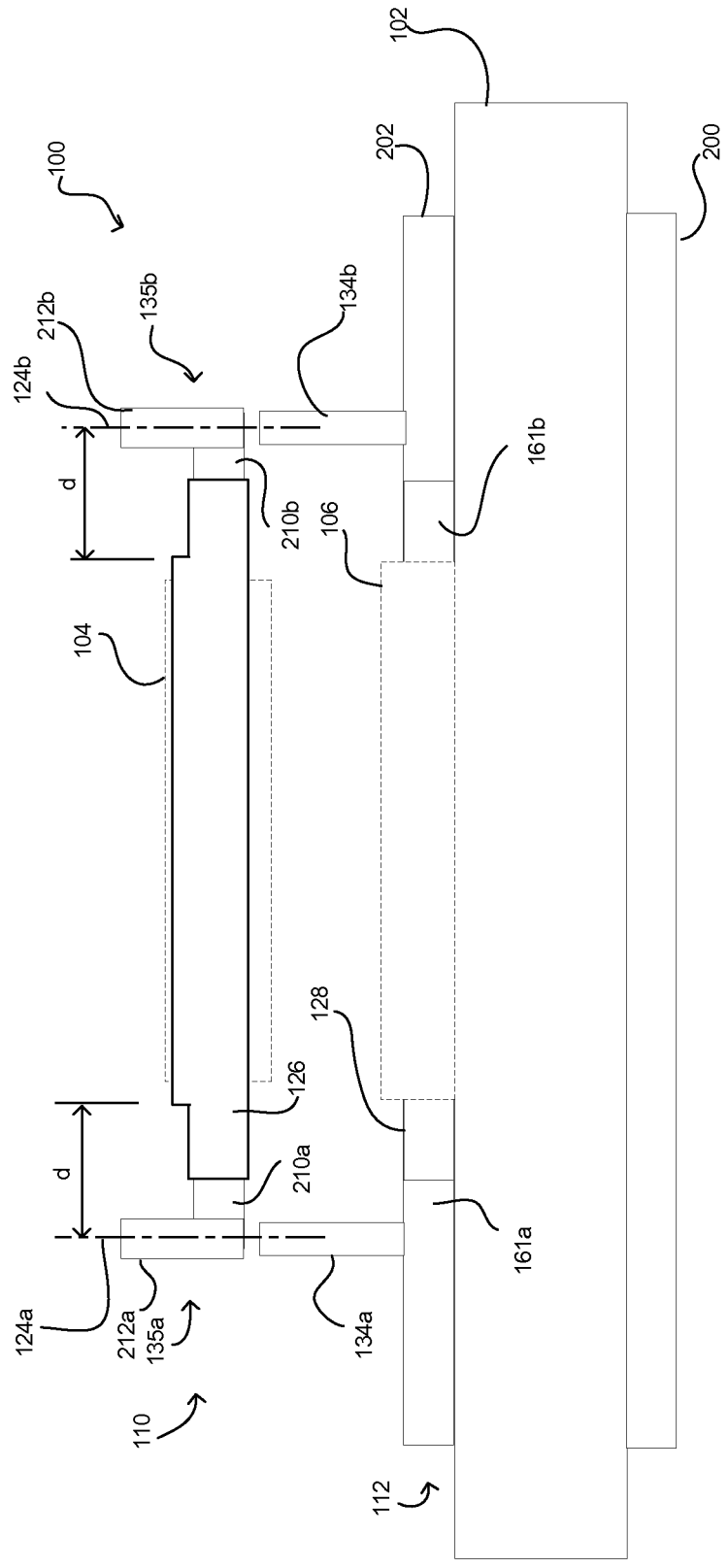
FIG. 9c is a schematic diagram illustrating another view of the loading position of the load frame during installation of the integrated circuit package stack as depicted in FIG. 5.
Figure 9D:
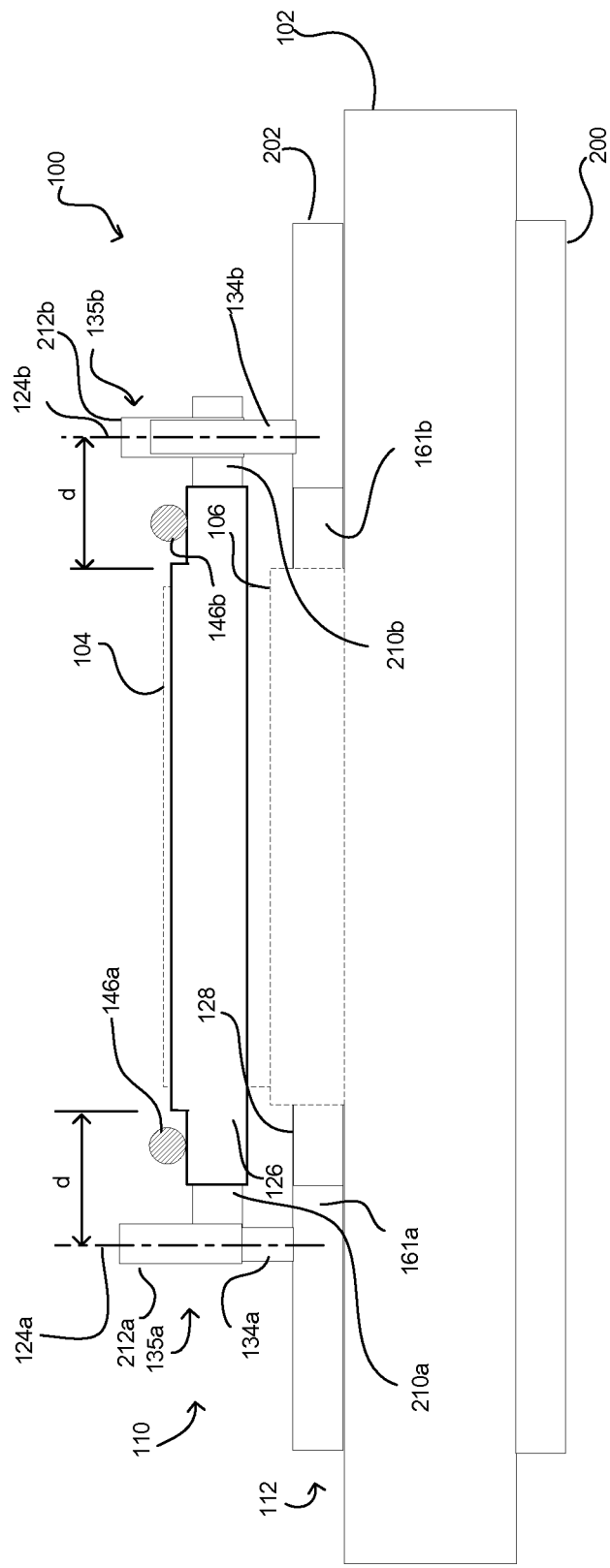
FIG. 9d is a schematic diagram illustrating an installed position of the integrated circuit package stack of FIG. 7.

In yet another aspect of the present description, as best seen in FIG. 3 and the schematic diagrams of FIGS. 9c, 9d, the finger grip handles 135a, 135b include flanges 210a, 210b, respectively, which extend laterally away from the rectangular core 126 of the load frame 110. The finger grip handles 135a, 135b further include upstanding finger grip tabs 212a, 212b which extend transverse to the flanges 210a, 210b, in a direction generally parallel to the alignment axes 124a, 124b. The finger grip tabs 212a, 212b of the finger grip handles 135a, 135b are spaced a lateral distance "d" from the integrated circuit package 104 when being installed in the socket 106. In the illustrated embodiment, the distance d is approximately 10 mm.

It is believed that such an arrangement can reduce or eliminate inadvertent damage to the contacts of the integrated circuit package 104 and the socket 106 while the alignment posts 134a, 134b of the base frame 112 are being inserted into the alignment openings 136a, 136b of the load frame flanges 160a, 160b during installation. For example, it is appreciated that the handle points of the finger grip tabs 212a, 212b of the finger grip handles 135a, 135b are not near but instead are spaced a significant distance from the contacts of either the integrated circuit package 104 or the socket 106. Such spacing can, it is believed reduce or eliminate accidental touching or bending of such contacts during installation. Accordingly, fingers are kept relatively far from the contact fields of the socket 106 or the integrated circuit package 104. Still further, it is believed that positioning the rectangular core 126 of the load frame 110 between the installer's fingers on the finger grip handles 135a, 135b and the contacts of socket 106 or the integrated circuit package 104, can provide a barrier of protection in the event a finger of the installer accidently slips off.

Other lateral distance displacements may also be suitable such as a distance d in a range of 5-20 mm, for example. Accordingly, other lateral distance displacement values may also be used depending upon the particular application. Although the finger grip tabs 212a, 212b of the finger grip handles 135a, 135b are depicted as being generally planar and rectangular in the illustrated embodiments, it is appreciated that other shapes may be used, depending upon the particular application. For example, the finger grip tabs 212a, 212b of the finger grip handles 135a, 135b may be curved to conform to the shape of a typical human finger tip.

Still further, orienting the finger grip tabs 212a, 212b generally parallel to the alignment axes 124a, 124b which is also the direction of travel when inserting or removing the load frame 110 and the integrated circuit package, is believed to further promote a secure grip on the load frame 110 during installation or removal. In the illustrated embodiment, the finger grip tabs 212a, 212b are sized to further promote a secure grip and reduce or eliminate accidental slippage. For example, the finger grip tabs 212a, 212b may in one embodiment, have a width of approximately 10 mm and a height of approximately 5 mm, which are somewhat smaller than the typical human finger tip. Accordingly, the finger grip tabs 212a, 212b may form a depression in the installer's fingers which conforms generally to the shape of the finger grip tabs 212a, 212b to further promote a secure grip. In other embodiments, the finger grip tabs 212a, 212b may have smaller or larger dimensions, depending upon the particular application.

In addition, adhesion between the finger grip tabs 212a, 212b and the installer's fingers may be further promoted by providing a "non-skid" texture on the finger grip tabs 212a, 212b. For example, the finger grip tabs 212a, 212b may have grip tape wrapped on the finger grip tabs 212a, 212b to promote safe handling. Other textures may be applied to the finger grip tabs 212a, 212b, depending upon the particular application.

Additional Embodiment Details

In certain embodiments, the stack embodiments may be embodied in a computer system including a video controller to render information to display on a monitor coupled to a computer system comprising a desktop, workstation, server, mainframe, laptop, handheld computer, etc. Alternatively, the stack embodiments may be embodied in a computing device that does not include a video controller, such as a switch, router, etc.

The illustrated operations of FIG. 8 show certain events occurring in a certain order. In alternative embodiments, certain operations may be performed in a different order, modified or removed. Moreover, operations may be added to the above described operations and still conform to the described embodiments. Further, operations described herein may occur sequentially or certain operations may be processed in parallel.

Figure 11:
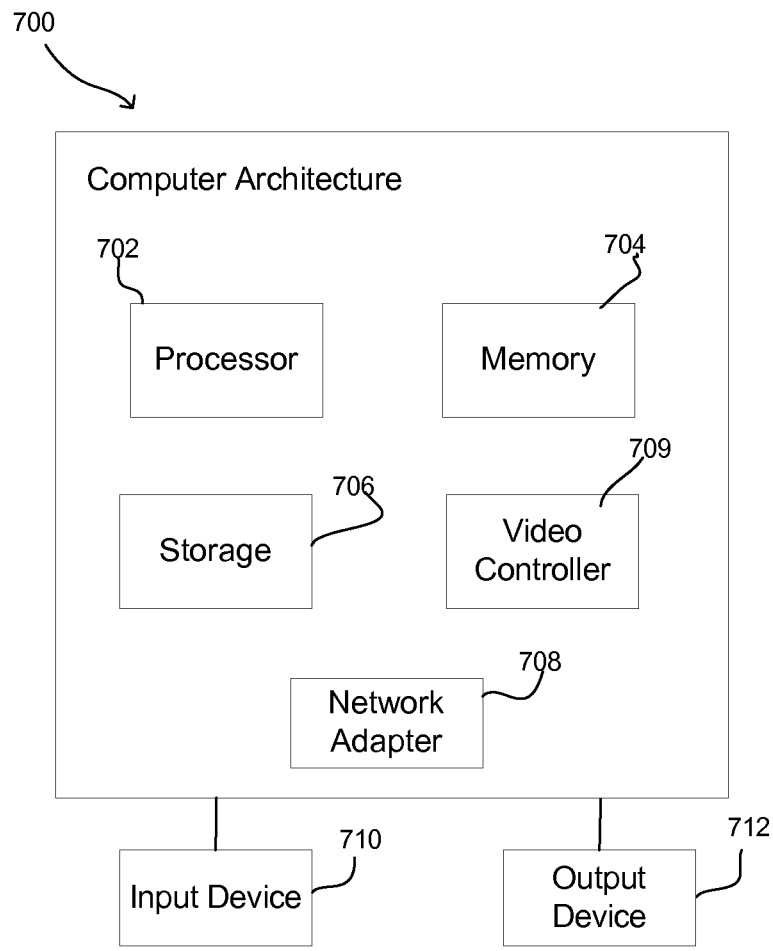
FIG. 11 illustrates an example of an architecture that may be used with the described embodiments.

FIG. 11 illustrates one embodiment of a computer architecture 700 which can utilize components, such the device 100 shown in FIG. 2. One or more components or devices may utilize an integrated assembly for installing an integrated circuit package on a substrate in accordance with the description provided herein.

The architecture 700 may include a processor 702 (e.g., a microprocessor), a memory 704 (e.g., a volatile memory device), and storage 706 (e.g., a non-volatile storage, such as magnetic disk drives, optical disk drives, a tape drive, etc.). The processor 702 may be mounted on a motherboard, for example. The storage 706 may comprise an internal storage device or an attached or network accessible storage. Programs in the storage 706 are loaded into the memory 704 and executed by the processor 702 in a manner known in the art or subsequently developed. The architecture further includes a network adapter 708 to enable communication with a network, such as an Ethernet, a Fibre Channel Arbitrated Loop, etc. Further, the architecture may, in certain embodiments, include a video controller 709 to render information on a display monitor, where the video controller 709 may be embodied on a video card or integrated on integrated circuit components mounted on the motherboard. Certain of the devices may have multiple cards or controllers. An input device 710 is used to provide user input to the processor 702, and may include a keyboard, mouse, pen-stylus, microphone, touch sensitive display screen, or any other activation or input mechanism known in the art or subsequently developed. An output device 712 is capable of rendering information transmitted from the processor 702, or other component, such as a display monitor, printer, storage, etc.

The network adapter 708 or other devices described herein may be mounted on an expansion card, such as a Peripheral Component Interconnect (PCI) card, PCI-express or some other I/O expansion card coupled to a motherboard, or on integrated circuit components mounted on the motherboard. Devices may be mounted directly to a card or may a stack in accordance with the description provided herein. Thus, stack embodiments may be embodied in computer systems or other systems in which a stack in accordance with the present description is mounted on one or both of a motherboard and an expansion card. Accordingly, in some system embodiments, the system may lack an expansion card, and a stack in accordance with the present description may be mounted on a motherboard. In another system embodiment, a stack in accordance with the present description may be mounted on an expansion card but not on a motherboard.

The foregoing description of various embodiments has been presented for the purposes of illustration and explanation. It is not intended to be exhaustive or to limit to the precise form disclosed. Many modifications and variations are possible in light of the above teaching.

What is claimed is:

1. A method, comprising:
preassembling a load frame and an integrated circuit device in a first preassembly with the integrated circuit device aligned relative to the load frame;
preassembling a second preassembly of a base frame and a socket coupled to a substrate so that electrical contacts of the socket of the second preassembly are spaced from electrical contacts of the integrated circuit device of the first preassembly in a first alignment position;
assembling the first preassembly and the second preassembly including the socket and the base frame coupled to the substrate, said assembling comprising:
aligning the first preassembly of the load frame and the integrated circuit device, with the base frame and socket of the second preassembly, along a first alignment axis defined by a first alignment post extending from the base frame to the load frame, in a direction transverse to the substrate and in the first alignment position with electrical contacts of the integrated circuit device spaced from electrical contacts of the socket carried by the substrate, said aligning further including inserting the first alignment post of said base frame in a first alignment opening of said load frame wherein said alignment post extends from said base frame and defines said first alignment axis, and sliding the first preassembly along the first alignment post toward the socket and toward a second alignment position in which electrical contacts of the integrated circuit device are aligned with and engaging electrical contacts of the socket carried by the substrate;
actuating a first biasing device carried on the base frame to engage and bias the load frame of the first preassembly toward the base frame aligned with the load frame, and to bias the integrated circuit device toward the socket carried by the substrate; and
latching the load and base frames together, aligned with and biased towards each other in the second alignment position with the electrical contacts of the integrated circuit device and the socket carried by the substrate aligned and engaged with, and biased toward each other.

2. The method of claim 1 wherein the load frame has a first flange extending laterally from a generally rectangular core of the load frame carrying the integrated circuit device, said load frame flange defining the first alignment opening and wherein said aligning includes inserting the first alignment post of said base frame in the first alignment opening spaced from the rectangular core of said load frame flange.

3. The method of claim 2 wherein said aligning includes grasping finger grip handles of the load frame which extend laterally from opposite sides of the rectangular core of the load frame carrying the integrated circuit device, and lowering the load frame in the direction of the alignment axis so that the first alignment post of said base frame is inserted into the first alignment opening of said load frame until electrical contacts of the integrated circuit device engage electrical contacts of the socket carried by the substrate.

4. The method of claim 3 wherein said finger grip handle grasping includes grasping finger grip handle tabs of the load frame finger grip handles, said finger grip handle tabs being spaced from the rectangular core of the load frame and extending in a direction generally parallel to the first alignment axis as the load frame is lowered so that the first alignment post of said base frame is inserted into the first alignment opening of said load frame flange.

5. The method of claim 1 wherein said aligning includes engaging an alignment surface of the first alignment opening in said load frame, with an alignment surface of the first alignment post so that the first alignment opening in said load frame is aligned with said first alignment axis defined by said first alignment post.

6. The method of claim 1 wherein said aligning includes lowering the load frame in the direction of the alignment axis so that the first alignment post of said base frame is inserted into the first alignment opening of said load frame until electrical contacts of the integrated circuit device engage electrical contacts of the socket carried by the substrate and wherein the first biasing device includes a first spring lever arm pivotally carried on the base frame, wherein said actuating the first biasing device includes pivoting the first spring lever arm to engage the load frame and press the load frame toward the base frame which presses the integrated circuit device toward the socket carried by the substrate.

7. The method of claim 1 wherein the assembling further comprises:
   aligning the first preassembly of the load frame and the integrated circuit device, with the second preassembly of the socket and base frame carried on a substrate, along a second alignment axis defined by a second alignment post extending from the base frame to the load frame, wherein said aligning includes lowering the load frame of the first preassembly in the direction of both the first and second alignment axes until electrical contacts of the integrated circuit device engage electrical contacts of the socket carried by the substrate; and
   actuating a second biasing device carried on the base frame to engage and bias the load frame toward the base frame aligned with the load frame, and to bias the integrated circuit device toward the socket carried by the substrate.

8. The method of claim 7 wherein said aligning along the second alignment axis includes inserting the second alignment post of said base frame in a second alignment opening of said load frame and wherein said second alignment post extends from said base frame and defines said first alignment axis.

9. The method of claim 8 wherein the first biasing device includes a first spring lever arm pivotally carried on the base frame, wherein said actuating the first biasing device includes pivoting the first spring lever arm to engage the load frame and press the load frame toward the base frame which presses the integrated circuit device toward the socket carried by the substrate, and wherein the second biasing device includes a second spring lever arm pivotally carried on the base frame, wherein said actuating the second biasing device includes pivoting the second spring lever arm to engage the load frame and press the load frame toward the base frame which presses the integrated circuit device toward the socket carried by the substrate.

10. The method of claim 9 wherein the load frame has a first flange extending laterally from a generally rectangular core of the load frame carrying the integrated circuit device, said load frame flange defining the first alignment opening and wherein said aligning includes inserting the first alignment post of said base frame in the first alignment opening spaced from the rectangular core of said load frame, wherein the load frame has a second flange extending laterally from the rectangular core of the load frame carrying the integrated circuit device, said load frame second flange defining the second alignment opening and wherein said aligning along the second alignment axis includes inserting the second alignment post of said base frame in the second alignment opening spaced from the rectangular core of said load frame.

11. The method of claim 10 wherein said rectangular core of the load frame defines a diagonal axis passing through a center of the rectangular core and wherein the first and second alignment openings of the first and second flanges, respectively, of the load frame, are aligned with the diagonal axis.

12. The method of claim 1 wherein the substrate is a printed circuit board having the socket to receive the integrated circuit device, wherein the latching includes latching the load and base frames together, aligned with and biased towards each other with the integrated circuit device and the socket aligned with, and biased toward each other.

13. A device for an integrated circuit device having electrical contacts and a substrate for carrying electrical contacts, comprising:
   a base frame configured for attachment to the substrate, said base frame having a first alignment post defining a first alignment axis and configured to extend in a direction transverse to the substrate;
   a socket configured for attachment to the substrate in alignment with the base frame, said socket having electrical contacts carried by the substrate;
   a load frame spaced from the socket in a first alignment position and shaped to carry the integrated circuit device in an aligned position relative to the load frame so that electrical contacts of the socket are spaced from electrical contacts of the integrated circuit device in the first alignment position, and wherein said load frame defines a first alignment opening configured to engage and receive the base frame alignment post in the first alignment position to align the load frame to the base frame and align the integrated circuit device to the socket and substrate with the electrical contacts of the integrated circuit device spaced from the electrical contacts of the socket carried by the substrate, said load frame alignment opening configured for sliding along the base frame alignment post from the first alignment position toward the socket and toward a second alignment position to align the load frame to the base frame and align the integrated circuit device to the socket and the substrate with the electrical contacts of the integrated circuit device aligned with and engaging the electrical contacts of the socket carried by the substrate;

a first biasing device carried on the base frame and configured to engage and bias the load frame toward the second alignment position with the base frame aligned with the load frame, and to bias the integrated circuit device toward the substrate; and a first latch carried on the base frame and configured to latch the load and base frames together, aligned with and biased towards each other in the second alignment position with the electrical contacts of the integrated circuit device aligned and engaged with the electrical contacts of the socket carried by the substrate.

14. The device of claim 13 wherein said first alignment post is configured to be inserted in said first alignment opening of said load frame to align said load frame to said base frame.

15. The device of claim 14 wherein the load frame has a generally rectangular core configured to carry the integrated circuit device, and a first flange extending laterally from the rectangular core of the load frame, said load frame flange defining the first alignment opening spaced from the rectangular core of the load frame.

16. The device of claim 15 wherein the load frame has finger grip handles which extend laterally from opposite sides of the rectangular core of the load frame.

17. The device of claim 16 wherein each said finger grip handle includes a finger grip handle tab extending in a direction generally parallel to the first alignment axis and spaced from the rectangular core of the load frame.

18. The device of claim 14 wherein said first alignment opening defines an alignment surface, wherein the first alignment post defines an alignment surface configured to engage the alignment surface of the first alignment opening so that the first alignment opening in said load frame is aligned with said first alignment axis defined by said first alignment post.

19. The device of claim 13 wherein the device includes said socket carried on the substrate and the first biasing device includes a first spring lever arm pivotally carried on the base frame, wherein said first spring lever arm is configured to engage the load frame and press the load frame toward the base frame which presses the integrated circuit device toward the socket carried by the substrate.

20. The device of claim 13 wherein said base frame has a second alignment post defining a second alignment axis and configured to extend in a direction transverse to the substrate and parallel to the first alignment axis and wherein the load frame is configured to engage the base frame second alignment post to align the load frame to the base frame and align the integrated circuit device to the substrate, said device further comprising:

a second biasing device carried on the base frame and configured to engage and bias the load frame toward the base frame aligned with the load frame, and to bias the integrated circuit device toward the substrate; and a second latch carried on the base frame and configured to latch the load and base frames together, aligned with and biased towards each other with the integrated circuit device and the substrate aligned with, and biased toward each other.

21. The device of claim 20 wherein said load frame defines a first alignment opening and wherein said first alignment post is configured to be inserted in said first alignment opening of said load frame to align said load frame to said base frame, and wherein said load frame defines a second alignment opening and wherein said second alignment post is configured to be inserted in said second alignment opening of said load frame to align said load frame to said base frame.

22. The device of claim 21 wherein the load frame has a generally rectangular core configured to carry the integrated circuit device, a first flange extending laterally from the rectangular core of the load frame, said load frame flange defining the first alignment opening spaced from the rectangular core of the load frame, and, a second flange extending laterally from the rectangular core of the load frame, said load frame second flange defining the second alignment opening spaced from the rectangular core of the load frame.

23. The device of claim 22 wherein said first alignment opening defines an alignment surface, wherein said first and second alignment posts each define an alignment surface adapted to engage the alignment surface of the associated alignment opening so that each alignment opening in said load frame is aligned with the associated alignment axis defined by the associated alignment post.

24. The device of claim 23 wherein said rectangular core of the load frame defines a diagonal axis passing through a center of the rectangular core and wherein the first and second alignment openings of the first and second flanges, respectively, of the load frame, are aligned with the diagonal axis.

25. The device of claim 20 wherein the substrate is a printed circuit board having said socket to receive the integrated circuit device, and wherein the first biasing device includes a first spring lever arm pivotally carried on the base frame, and the second biasing device includes a second spring lever arm pivotally carried on the base frame, and wherein each spring lever arm is configured to engage the load frame and press the load frame toward the base frame which presses the integrated circuit device toward the socket carried by the substrate.

26. The device of claim 13 wherein the substrate is a printed circuit board having said socket to receive the integrated circuit device, wherein the latching includes latching the load and base frames together, aligned with and biased towards each other with the integrated circuit device and the socket aligned with, and biased toward each other.

27. A system, comprising:

a motherboard having a socket on the motherboard, said socket having electrical contacts;

at least one system memory;

a base frame attached to the motherboard, said base frame having an alignment post defining an alignment axis extending in a direction transverse to the motherboard;

a socket coupled to the motherboard in alignment with the base frame, said socket having electrical contacts;

an integrated circuit processor configured to be received in the socket and having electrical contacts;

a load frame spaced from the socket in a first alignment position and shaped to carry the processor so that electrical contacts of the socket are spaced from electrical contacts of the integrated circuit processor in the first alignment position and wherein said load frame defines a first alignment opening configured to engage and receive the base frame alignment post in the first alignment position to align the load frame to the base frame and align the processor to the socket with the electrical contacts of the processor spaced from the electrical contacts of the socket, said load frame alignment opening configured for sliding along the base frame alignment post from the first alignment position toward a second alignment position to align the load frame to the base frame and align the processor to the socket with the electrical contacts of the processor aligned with and engaging the electrical contacts carried by the socket;

a biasing device carried on the base frame and engaging and biasing the load frame toward the second alignment position with the base frame aligned with the load frame, and biasing the processor toward the socket; and a latch carried on the base frame and configured to latch the load and base frames together, aligned with and biased towards each other in the second alignment position with the electrical contacts of the processor and aligned and engaged with the electrical contacts of the socket;

an expansion card coupled to said motherboard; and a controller disposed on said expansion card.

28. The system of claim 27 wherein the load frame has a generally rectangular core carrying the integrated circuit processor, and a flange extending laterally from the rectangular core of the load frame, said load frame flange defining an alignment opening spaced from the rectangular core of the load frame, wherein said alignment opening defines an alignment surface, wherein the alignment post defines an alignment surface engaging the alignment surface of the alignment opening so that the alignment opening in said load frame is aligned with said alignment axis defined by said alignment post, wherein the load frame has finger grip handles which extend laterally from opposite sides of the rectangular core of the load frame, and wherein each said finger grip handle includes a finger grip handle tab extending in a direction generally parallel to the alignment axis and spaced from the rectangular core of the load frame.

* * * * *